United States Patent [19]

Tachi et al.

[11] Patent Number: 4,986,877
[45] Date of Patent: Jan. 22, 1991

[54] METHOD OF DRY ETCHING

[75] Inventors: Shinichi Tachi, Sayama; Kazunori Tsujimoto, Higashiyamato; Sadayuki Okudaira, Ome, all of Japan

[73] Assignee: Hitachi, Ltd., Tokyo, Japan

[21] Appl. No.: 223,642

[22] Filed: Jul. 25, 1988

[30] Foreign Application Priority Data

Jul. 29, 1987 [JP] Japan .................. 62-187535

[51] Int. Cl.$^5$ .................. C23F 1/02; B44C 1/22
[52] U.S. Cl. .................. 156/643; 156/644; 156/646; 156/656; 156/657; 156/662; 156/665
[58] Field of Search .............. 156/643, 646, 665, 644, 156/662, 626, 656, 657; 437/947, 981; 204/192.37, 192.35

[56] References Cited

U.S. PATENT DOCUMENTS

| 4,595,453 | 6/1986 | Yamazaki et al. | 156/646 X |
| 4,618,398 | 10/1986 | Nawata et al. | 156/646 X |
| 4,726,879 | 2/1988 | Bondur et al. | 156/646 X |
| 4,798,650 | 1/1989 | Nakamura et al. | 156/643 |

FOREIGN PATENT DOCUMENTS

| 030116 | 6/1981 | European Pat. Off. |
| 181188 | 5/1986 | European Pat. Off. |
| 258698 | 3/1988 | European Pat. Off. |
| 158627 | 8/1985 | Japan |

OTHER PUBLICATIONS

Chen et al., "Tapered Via Hole", IBM Tech. Discl. Bulletin, vol. 26, No. 12, May 1984.
Patent Abstracts of Japan, vol. 6, No. 67 (E-104)[945], Apr. 28, 1982, relating to JP-A-57 7936.
Solid State Technology, vol. 23, No. 11, pp. 85-91, Nov. 1980, Schwartz et al.: "Reactive Ion Etching in Chlorinated Plasmas".

Primary Examiner—David A. Simmons
Assistant Examiner—Thi Dang
Attorney, Agent, or Firm—Antonelli, Terry, Stout & Kraus

[57] ABSTRACT

A first etching for large side etching is conducted while maintaining the temperature of an article to be etched at a first temperature, and a second etching for small side etching is then conducted while maintaining the article to be etched at a second temperature lower than the first temperature. This enables the formation of various patterns in which the upper part of the sidewall is inclined at an angle smaller than that of the lower part of the sidewall.

16 Claims, 3 Drawing Sheets

METHOD OF DRY ETCHING

BACKGROUND OF THE INVENTION

The present invention relates to a method of dry etching and particularly to a method of low-temperature dry etching suitable for formation of various patterns having a tapered sidewall.

As is well known, with an increase in the density of integration of a semiconductor device and a decrease in the size of various elements, such as a resistor or a transistor, a recent trend in a wiring, an insulating film, etc. is to have a perpendicular sidewall for the purpose of decreasing the necessary area. However, this expedient has raised a problem that when another wiring or insulating film is formed on the perpendicular wiring or insulating film, a newly formed wiring or insulating film comes to be cut by the sharp edge of the underlying wiring or insulating film. In order to overcome this problem, the sidewall of the wiring, insulating film, or the like has been tapered in such an extent that the above-described cutting can be prevented. Therefore, there has been desired a method of dry etching which enables an article, such as a wiring or an insulating film, to be etched while regulating the taper of the sidewall of the article with high accuracy (in the present specification, the above-described dry etching for forming a pattern having a tapered sidewall is hereinafter referred to as "taper dry etching").

A conventional method of taper dry etching proposed in, for example, Proceeding of Dry Process Symposium, (IEE of JAPAN, Tokyo) P48 (1984) comprises etching an article to be etched by introducing a mixture composed of an etching gas and a depositing type gas into a reaction chamber.

However, this method has a problem that the incorporation of a depositing type gas brings about lowering in both the etching rate and the selection ratio. Further, since the depositing type gas is deposited on a semiconductor substrate to be etched, the deposition brings about the contamination of the surface of the substrate. This in turn causes a lowering in the yield of the product.

SUMMARY OF THE INVENTION

An object of the present invention is to solve the above-described problems accompanying the conventional taper dry etching method and to provide a method of taper dry etching which enables not only etching at a sufficiently high rate but also remarkable reduction in the contamination of a semiconductor substrate to be etched.

In order to attain the above object, in the present invention, dry etching is started while maintaining a substrate to be etched at a temperature far lower than that generally used in the conventional method, e.g., a temperature as low as 0° C. or below, and the temperature of the substrate is stepwise or continuously varied during dry etching with the lapse of processing time.

DETAILED DESCRIPTION OF THE PREFERRED EMBODIMENTS

Studies conducted by the present inventors have revealed that when a substrate to be etched is cooled and dry etching is then conducted while maintaining the substrate at a very low temperature, i.e., 0° C. or below, it is possible to conduct highly anisotropic etching accompanied with only small sidewall etching by making use of only a non-depositing type gas free from C and Si without using the above-described depositing type gas. Further, it has been found that the sidewall etching rate can easily be varied by varying the temperature of the substrate. Therefore, when the temperature of the substrate is varied in the course of etching and the etching is further continued, a sidewall inclined at an angle according to the temperature can be prepared, thus enabling the sidewall to be inclined at a desired angle.

The term "depositing type gas" used herein is intended to mean a gas containing C or Si, such as $CCl_4$, which causes the deposition of a polymer or the like on the substrate during etching, and the term "non-depositing type gas" used herein is intended to mean a gas free from C and Si which causes little or no deposition of a polymer or the like on the substrate during etching.

EXAMPLE 1

Figure 1A:
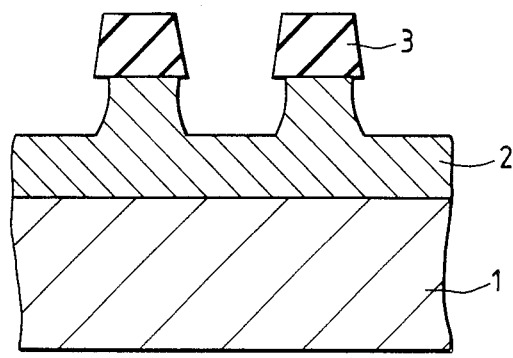
FIGS. 1a and 1b are each a cross-sectional view of an article showing an example of the method according to the present invention.
Figure 1B:
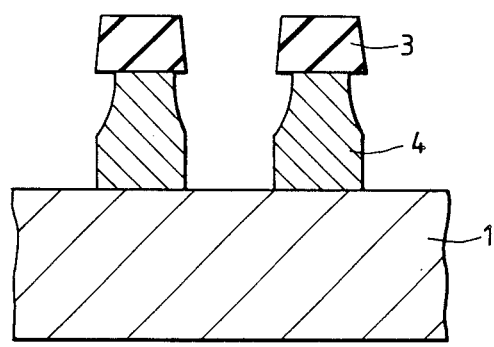

FIGS. 1a and 1b are each an example of taper etching of a 2 μm-thick film 2 comprising aluminum or an alloy mainly composed of aluminum, such as aluminum-silicon, deposited on a silicon substrate 1. A photoresist film 3 was used as an etching mask of the aluminum or aluminum-base alloy film 2. Reactive ion etching was conducted by making use of an etching gas comprising a $Cl_2$ gas under conditions of a pressure chamber pressure of 0.1 Torr and an input power of 400 W. The substrate to be etched was placed on a cooling table of a well-known plane-parallel plate dry etching apparatus, and a temperature controlling (+200° C.—−150° C.) mechanism was provided so that the temperature of the substrate can be varied to a desired value during etching.

The cross section of a substrate etched for about 2 min while maintaining the temperature at −5° C. was as shown in FIG. 1a. The etching proceeded at a rate of 0.5 μm/min in the depthwise direction of the substrate, while in the lateral direction, side etching occurred at a rate of 0.1 μm/min. Then, the temperature of the substrate was lowered to −15° C., and the etching was further continued for 2 min under the same conditions. This etching caused little or no side etching, and the cross section of the etched substrate was as shown in FIG. 1b. As is apparent from FIG. 1b, the upper half part of the pattern of the formed aluminum film 4 was thin due to the occurrence of side etching, while the lower half part was not thin because no side etching occurred. Therefore, the upper part of an opening formed between two adjacent patterns of aluminum film 4 had an area larger than that of the lower part thereof, so that an insulating material could easily be embedded between the two aluminum film patterns 4.

Thus, taper dry etching in which the inclination of the sidewall is varied can be conducted by utilizing the change in the side etching rate with the variation in the temperature of the substrate. Although the temperature of the substrate was varied from −5° C. to −15° C. in one step in this Example, the temperature of the substrate can be varied from −5° C. to −15° C. in a plurality of separate steps so that the etching can be conducted at, e.g., −10° C. This causes the upper half part of the sidewall of the aluminum pattern 4 to have a smooth inclination.

A further detailed study has revealed that when the temperature of the substrate is varied not stepwise but continuously, the sidewall has a very smooth inclination and a pattern having a very favorable form can be prepared.

Further, it has been found that when the temperature for anisotropic etching and the temperature for side etching are set so that the difference in their temperatures is 10° C. or above, both the temperature and the form of the taper can be easily controlled. Therefore, it is preferred to conduct the anisotropic etching and the side etching so as to have a temperature difference of 10° C. or above therebetween.

EXAMPLE 2

In the present Example, taper dry etching of a polysilicon film will be described.

An $SF_6$ gas was used as an etching gas. The etching of the lower half part for forming a sidewall inclined at a large angle was conducted at −100° C., while the etching of the upper half part for causing large side etching was conducted at −80° C., thereby etching a 1 μm-thick polysilicon film.

Figure 2:
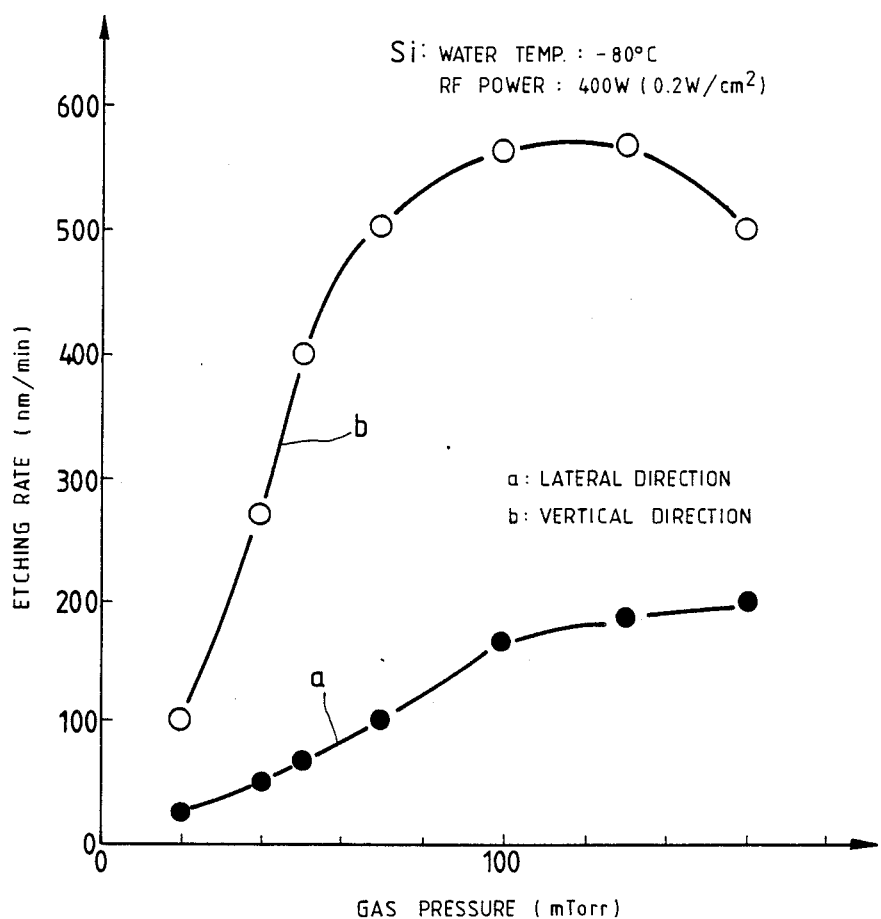
FIGS. 2 and 3 are a graph showing the relationship between etching rate and gas pressure and a graph showing the relationship between etching rate and RF power, respectively.
Figure 3:
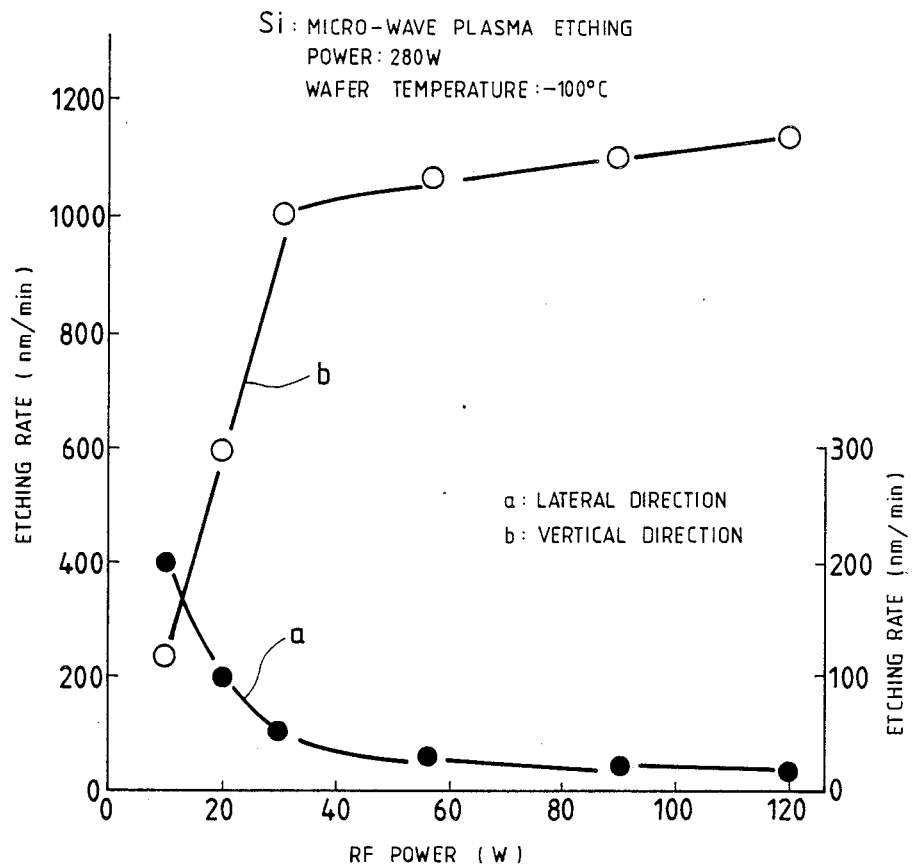

The etching apparatus was the same as that used in Example 1, i.e., a plane-parallel plate etching apparatus, and the etching was conducted under conditions of a gas pressure of 70 mTorr and an input power of 400 W. When the temperature of the film was −80° C., the lateral (face) etching rate and the vertical etching rate were 0.1 μm/min and 0.5 μm/min, respectively, while when the temperature of the film was −100° C., the lateral etching rate and the vertical etching rate were 0.03 μm/min and 0.5 μm/min, respectively. When the gas pressure was varied while maintaining the temperature at −80° C., the etching rate in the depthwise direction and that in the lateral direction were both varied as shown in FIG. 2. Therefore, the difference in the etching rate between the depthwise direction and the lateral direction can be made remarkably large by properly selecting the gas pressure A microwave plasma etching apparatus was used as the etching apparatus, and etching was conducted under conditions of a gas pressure of 5 mTorr, an input power of 280 W and an RF bias of 30 W. When the temperature of the film was −80° C., the lateral etching rate and the vertical etching rate were 0.1 μm/min and 1 μm/min, respectively, while when the temperature of the film was −100° C., the lateral etching rate and the vertical etching rate were 0.05 μm/min and 1 μm/min, respectively. The dependency of the etching rate upon the bias power was as shown in FIG. 3. Since the degree of the side etching varies depending upon the power, the difference in the etching rate between the lateral and vertical directions can be made very large by properly selecting the power. Side etching did not occur at a temperature of −130° to −110° C.

Substantially the same results were obtained when a single-crystal film and a silicide film were used instead of the polysilicon film. Further, a deep channel for isolation or channel capacitor could be formed on a silicon substrate by etching the silicon substrate through proper selection of the temperature ranging from −130° to −40° C. That is, according to the present invention, a deep channel is provided having a Y-shaped cross section in which the sidewall of the upper part is inclined at an angle larger than that of the lower part. This made it very easy to fill an insulating material or polysilicon within the deep channel, so that the reliability of the semiconductor device was remarkably improved. It is noted that $SF_6$ is preferably used as the etching gas.

EXAMPLE 3

In the present Example, the etching of an $SiO_2$ film and an $Si_3N_4$ film will be described. When an article to be etched was an $SiO_2$ film, the first etching for large side etching was conducted at a temperature of +20° to +100° C., and the second etching for small side etching was conducted at a temperature of −5° to −100° C. Since the degree of the side etching is small when the etching is conducted at about 0° C., it is preferred, as described above, to conduct the first etching at a slightly higher temperature. A fluorocarbon can be used as the etching gas, and examples thereof include $CF_4+H_2$ and $CHF_3$.

When an article to be etched was an $Si_3N_4$ film, the first etching for large side etching was conducted at a temperature of +60° to −60° C., and the second etching for small side etching was conducted at a temperature of −60° to −130° C. $CF_4+O_2$, $CF_4$, $SF_6+CCl_4$, etc. were used as the etching gas. With all of the above-described etching gases good results could be obtained. Although each of $CF_4$ and $CCl_4$ contains C and is therefore a depositing type gas, they may be used in some cases in the present invention. Specifically, when an article to be etched is an $SiO_2$ film, residue-free etching can be conducted only when the etching gas comprises C and F because the presence of C and F brings about the formation of $SiF_4$ and CO. Similarly, when an article to be etched is an $Si_3N_4$ film, the use of $CF_4$ as the etching gas brings about the formation of $SiF_4$ and CN, which causes the progress of the etching. That is, as opposed to the case where Si and Al films are etched, a gas containing suitable amounts of C and F serves as the non-depositing type gas when $SiO_2$ and $Si_3N_4$ films are to be etched.

EXAMPLE 4

In the present Example, the formation of a photoresist pattern through etching of a photoresist film will be described. The etching of a photoresist film was conducted by $O_2$ plasma at a temperature selected from a range of 0° to −100° C. In the above etching, the inclination of the sidewall could be controlled within an angle range of 60° to 90°, and a photoresist pattern having a desired cross section could be formed.

It is needless to say that various materials other than those used in the above Examples can be etched according to the present invention. The kind of the etching gas and wafer temperature may properly be selected according to the materials to be etched. With respect to the etching apparatus as well, a magnetron plasma etching apparatus may also be used besides the two above-described apparatuses.

What is claimed is:

1. A method of dry etching comprising a first step of bringing an article to be etched placed within a reaction chamber into contact with a plasma of an etching gas while maintaining said article at a first temperature to etch an exposed surface of said article at a predetermined first side etching rate and a second step of continuing the contact of said article with the plasma of said etching gas while maintaining said article at a second temperature lower than said first temperature to etch said article at a second side etching rate smaller than said first side etching rate.

2. A method of dry etching according to claim 1, wherein the first step is switched to the second step by stepwise varying the first temperature to the second temperature.

3. A method of dry etching according to claim 2, wherein said dry etching forms a deep trench in said article, the first step being conducted for a period of time sufficient to form an upper sidewall portion of said deep trench having a predetermined taper and said first step then being switched to said second step by changing the first temperature to the second temperature in one step, and wherein the upper sidewall portion formed in said first step is inclined at an angle, relative to the bottom of the trench, which is smaller than that of a second lower sidewall portion of said deep trench, said lower sidewall portion being formed by said second step.

4. A method of dry etching according to claim 2, wherein said dry etching forms a deep trench in said article, said first step being conducted for a period of time sufficient to form an upper sidewall portion having a predetermined taper and said first step being switched to said second step by varying the first temperature to the second temperature in a plurality of steps, and wherein the sidewall portions formed by said first and second steps have smooth inclinations such that said upper sidewall portion formed by said first step is inclined at an angle, relative to the bottom of the trench, which is smaller than that of a lower sidewall portion formed by said second step.

5. A method of dry etching according to claim 1, wherein the first step is witched to the second step by continuously varying the first temperature to the second temperature.

6. A method of dry etching according to claim 5, wherein said dry etching forms a deep trench in said article, an upper sidewall portion of said trench formed by said first step being inclined at an angle, relative to the bottom of the trench, which is smaller than that of a lower sidewall portion formed by said second step, and wherein the sidewall portions formed by said method of dry etching have smooth inclinations.

7. A method of dry etching according to claim 1, wherein said dry etching forms a deep trench in said article, a lower sidewall portion of said trench formed in the second step being substantially perpendicular to a main surface of said article.

8. A method of dry etching according to claim 1, wherein said etching is conducted by making use of a plane-parallel plate dry etching apparatus.

9. A method of dry etching according to claim 1, wherein said etching is conducted by making use of a microwave plasma etching apparatus.

10. A method of dry etching according to claim 1, wherein said article to be etched is a film of a material selected from among aluminum and aluminum alloys and said etching gas is $Cl_2$.

11. A method of dry etching according to claim 1, wherein said article to be etched is a polysilicon film and said etching gas is $SF_6$.

12. A method of dry etching according to claim 1, wherein said article to be etched is a single-crystal silicon substrate and said etching gas is $SF_6$.

13. A method of dry etching comprising a first step of bringing an article to be etched placed within a reaction chamber into contact with a plasma of an etching gas while maintaining said article at a first temperature to etch an exposed surface of said article at predetermined first side etching rate and a second step of continuing the contact of said article with the plasma of said etching gas while maintaining said article at a second temperature lower than said first temperature to etch said article at a second side etching rate smaller than said first side etching rate, wherein said dry etching forms a deep trench in said article, in which an upper sidewall portion of said deep trench, which is formed by said first step, is inclined at an angle, relative to the bottom of the trench, which is smaller than that of a lower sidewall portion of said deep trench, said lower sidewall portion being formed by said second step.

14. A method of dry etching according to claim 1, wherein said second temperature is at least 10° C. lower than said first temperature.

15. A method of dry etching according to claim 1, wherein said etching gas is a non-depositing type gas.

16. A method of dry etching according to claim 1, wherein said etching gas is free from C and Si.

* * * * *